United States Patent [19]

Seki et al.

[11] Patent Number: 4,507,574
[45] Date of Patent: Mar. 26, 1985

[54] CONSTANT OPERATION SPEED LOGIC CIRCUIT

[75] Inventors: Teruo Seki; Takahiko Yamauchi, both of Kawasaki; Keizo Aoyama, Yamato, all of Japan

[73] Assignee: Fujitsu Limited, Kawasaki, Japan

[21] Appl. No.: 449,767

[22] Filed: Dec. 14, 1982

[30] Foreign Application Priority Data

Dec. 14, 1981 [JP] Japan .................. 56-201077

[51] Int. Cl.³ ............... H03K 19/017; H03K 19/094; H03K 19/096
[52] U.S. Cl. .................. 307/448; 307/443; 307/449; 307/451; 307/453; 307/591; 307/601; 307/605
[58] Field of Search ............... 307/441, 443, 448, 449, 307/451–453, 575–577, 579, 582–585, 591, 601, 605

[56] References Cited

U.S. PATENT DOCUMENTS

| | | |
|---|---|---|
| 3,651,342 | 3/1972 | Dingwall . |
| 3,943,551 | 3/1976 | Skorup . |
| 4,074,150 | 2/1978 | Buckley et al. . |
| 4,367,420 | 1/1983 | Foss et al. .................. 307/468 X |
| 4,394,586 | 7/1983 | Morozumi .................. 307/452 X |
| 4,401,903 | 8/1983 | Iizuka .................. 307/449 |
| 4,409,434 | 10/1983 | Basset et al. .................. 307/468 X |

OTHER PUBLICATIONS

European Search Report, Berlin, 02-23-1983.

Primary Examiner—Stanley D. Miller
Assistant Examiner—D. R. Hudspeth
Attorney, Agent, or Firm—Staas & Halsey

[57] ABSTRACT

A logic circuit includes a plurality of input terminals ($IN_1$, $IN_2$, ...), an output terminal (OUT), a load (L), and at least two driver circuits ($D_1$, $D_2$, ...). Each of the driver circuits includes a plurality of gates connected in series, each gate being driven by one of the potentials at the input terminals. In addition, the first gates ($Q_{11}$, $Q_{22}$, ... or $Q_{11}'$, $Q_{22}'$, ...) of the driver circuit connected directly to the output terminal are driven by different potentials at the input terminals.

11 Claims, 50 Drawing Figures

Fig. 1 PRIOR ART
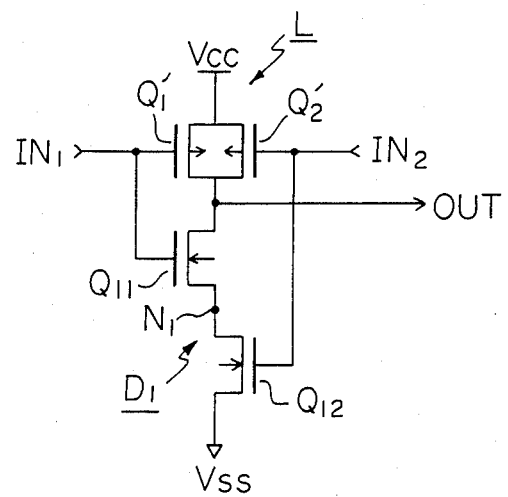
PRIOR ART
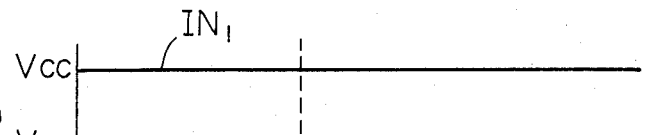
Fig. 2A
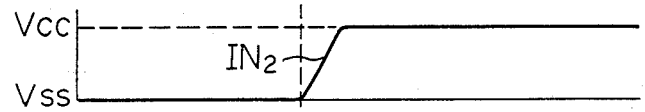
Fig. 2B
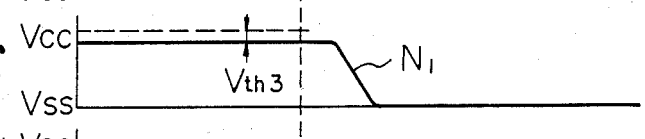
Fig. 2C
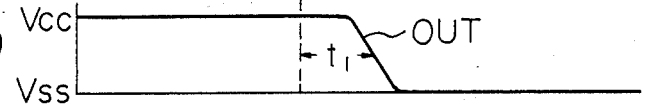
Fig. 2D PRIOR ART
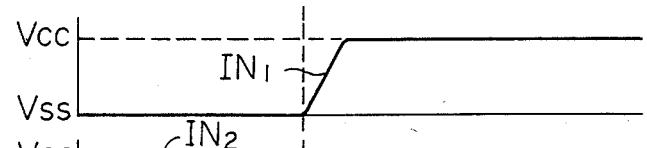
Fig. 3A
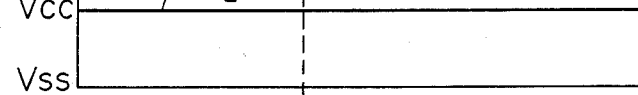
Fig. 3B
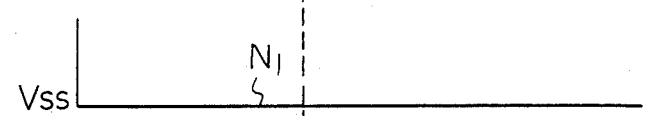
Fig. 3C
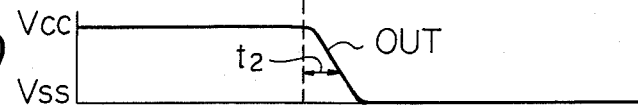
Fig. 3D
Fig. 4 PRIOR ART
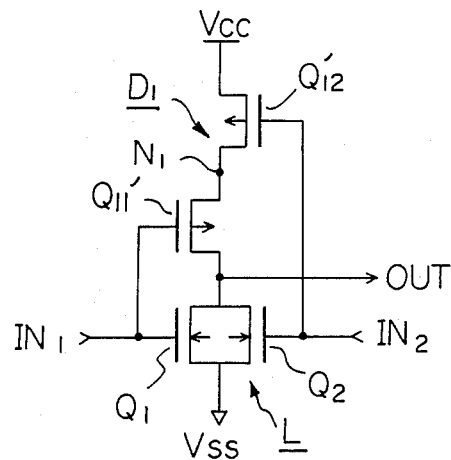

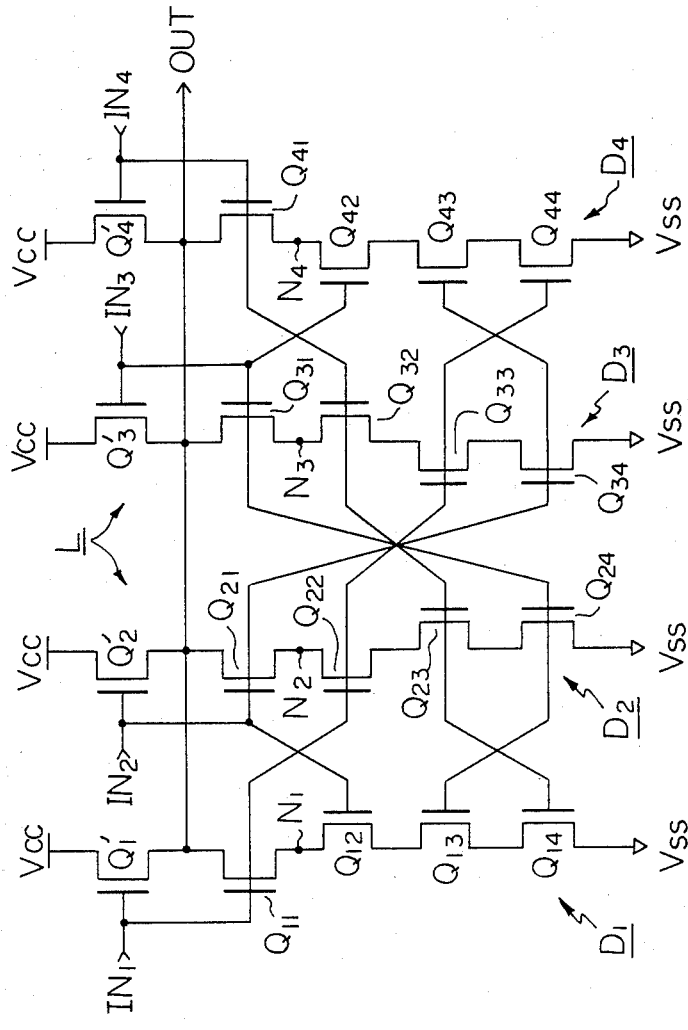

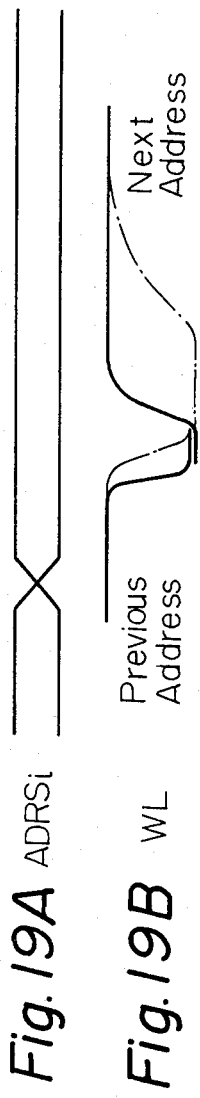

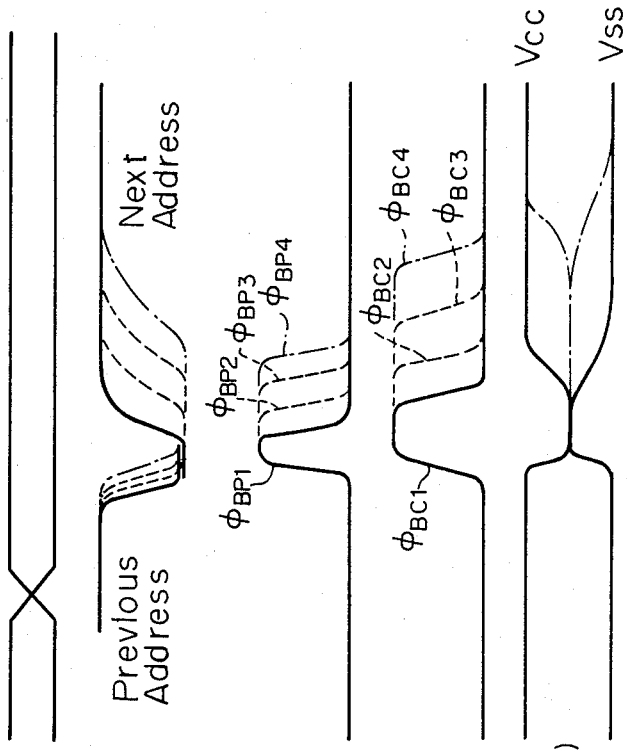

CONSTANT OPERATION SPEED LOGIC CIRCUIT

BACKGROUND OF THE INVENTION

1. Field of the Invention

The present invention relates to a logic circuit such as a NAND circuit or an NOR circuit. Such a logic circuit is often used in address decoders, a bit line control clock generator circuit, etc of a memory device.

2. Description of the Prior Art

A prior art logic circuit such as a NAND circuit or a NOR circuit comprises a load, a single driver circuit driven by the potentials at two or more input terminals, and an output terminal connected between the load and the driver circuit. The driver circuit has a plurality of gates which are driven by the potentials at the input terminals.

In the above-mentioned prior art, however, the presence or absence of charges at an intermediate node of the gates generates a fluctuation in operation speed. In this case, the operation speed is dependent upon the condition of input signals. As a result, the overall operation speed is substantially reduced.

SUMMARY OF THE INVENTION

It is an object of the present invention to provide a logic circuit in which the operation speed is constant under any condition of input signals.

According to the present invention, at least two driver circuits are provided. Preferably, the same number of driver circuits is provided as input terminals. The driver circuits are connected in parallel with each other. The gates of the driver circuits connected directly to the output terminal are driven by different potentials at the output terminals. Therefore, at least one of the driver circuits operates rapidly in response to changes of input signals so as to change the potential at the output terminal. As a result, no fluctuation in operation speed is generated under any condition of the input signals, and, in addition, the operation speed is increased.

The present invention will be clearly understood from the description as set forth below contrasting the prior art with the present invention and referring to the accompanying drawings.

BRIEF DESCRIPTION OF THE DRAWINGS

FIG. 1 is a circuit diagram of a prior art logic circuit;

FIGS. 2A through 2D and FIGS. 3A through 3D are timing diagrams of the signals appearing in the circuit of FIG. 1;

FIG. 4 is a circuit diagram of another prior art logic circuit;

FIGS. 7A through 7D, FIGS. 8A through 8D, FIGS. 9A and 9B, and FIGS. 10A and 10B are circuit diagrams of embodiments of the logic circuit according to the present invention;

FIGS. 19A through 19E are timing diagrams for explaining the operation of the circuit of FIG. 16;

FIGS. 21A through 21E are timing diagrams for explaining the operation of the circuits of FIGS. 20A and 20B.

DESCRIPTION OF THE PREFERRED EMBODIMENTS

Figure 5A:
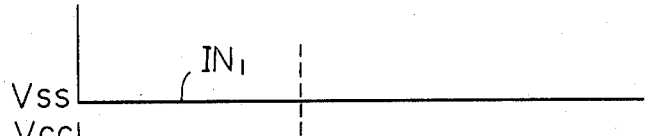
FIGS. 5A through 5D and FIGS. 6A through 6D are timing diagrams of the signals appearing in the circuit of FIG. 4.
Figure 5B:
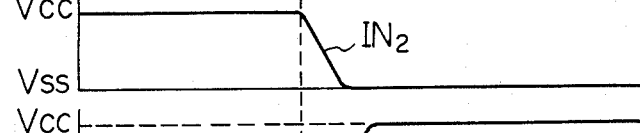
Figure 5C:
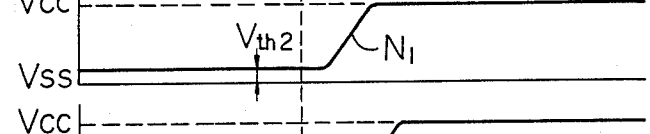
Figure 5D:
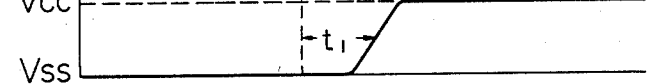
Figure 6A:
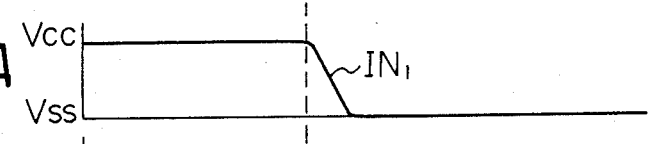
Figure 6B:
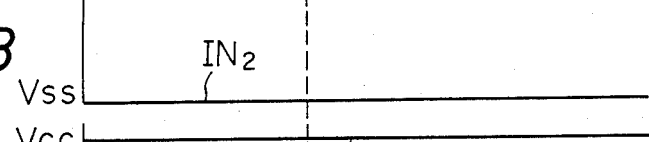
Figure 6C:
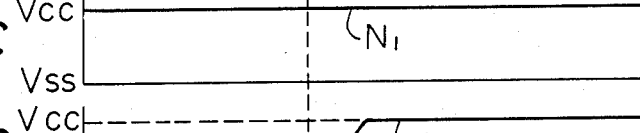
Figure 6D:
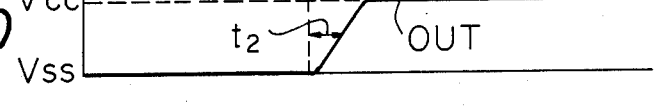

In FIG. 1, which is a prior art two-input complementary metal-insulator-semiconductor (CMIS) NAND circuit, two P-channel transistors $Q_1'$ and $Q_2'$ are connected in parallel between a power supply $V_{cc}$ and an output terminal OUT to form a load L. The transistors $Q_1'$ and $Q_2'$ are driven by the potentials at the input terminals $IN_1$ and $IN_2$, respectively. In addition, two N-channel transistors $Q_{11}$ and $Q_{12}$ are connected in series between a power supply $V_{ss}$, having a lower potential than the power supply $V_{cc}$, and the output terminal OUT to form a driver circuit $D_1$. The transistors $Q_{11}$ and $Q_{12}$ are also driven by the potentials at the input terminals $IN_1$ and $IN_2$, respectively. Note that the "apostrophe" on the references designates "P-channel type".

The operation of the circuit of FIG. 1 will now be explained with reference to FIGS. 2A through 2D and FIGS. 3A through 3D. As illustrated in FIGS. 2A and 2B, when the potential at the input terminal $IN_1$ remains at $V_{cc}$ and, in addition, the potential at the input terminal $IN_2$ is changed from $V_{ss}$ to $V_{cc}$, the potential at the output terminal OUT is changed from $V_{cc}$ to $V_{ss}$, as illustrated in FIG. 2D. In this case, however, before the change of the potential at the input terminal $IN_2$, the transistors $Q_2'$ and $Q_{11}$ are both turned on and the transistors $Q_1'$ and $Q_{12}$ are turned off, so that a node $N_1$ connecting the transistor $Q_{11}$ to the transistor $Q_{12}$ is charged at $V_{cc}-V_{th3}$, where $V_{th3}$ is the threshold voltage of the transistor $Q_{11}$, as illustrated in FIG. 2C. As a result, even when the potential at the input terminal $IN_2$ is changed from $V_{ss}$ to $V_{cc}$ so as to turn off the transistor $Q_2'$ and turn on the transistor $Q_{12}$, the potential at the output terminal OUT does not become $V_{ss}$ until the node $N_1$ is discharged, resulting in a relatively large delay time $t_1$.

On the other hand, as illustrated in FIGS. 3A and 3B, when the potential at the input terminal $IN_2$ remains at $V_{cc}$ and, in addition, the potential at the input terminal $IN_1$ is changed from $V_{ss}$ to $V_{cc}$, the potential at the output terminal OUT is also changed from $V_{cc}$ to $V_{ss}$, as illustrated in FIG. 3D. This operation is logically the same as the above-mentioned operation. In this case, before the change of the potential at the input terminal $IN_1$, the transistors $Q_1'$ and $Q_{12}$ are turned on and the transistors $Q_2'$ and $Q_{11}$ are turned off, so that the potential at the node $N_1$ is at $V_{ss}$, as illustrated in FIG. 3C. Therefore, when the potential at the input terminal $IN_1$ is changed from $V_{ss}$ to $V_{cc}$, so as to turn off the transistor $Q_1'$, and turn on the transistor $Q_{11}$, the potential at the node $N_1$ is changed with a relatively small delay time $t_2$, since it is unnecessary to discharge the node $N_1$.

Thus, a difference in speed between the operation as shown in FIGS. 2A through 2D and the operation as shown in FIGS. 3A through 3D, is generated. This difference is inherent in the construction of the series connection of the transistors $Q_{11}$ and $Q_{12}$.

The above-mentioned difference in operation speed similarly occurs in the case of a NOR circuit as illustrated in FIG. 4, which is a prior art two-input CMIS NOR circuit. In FIG. 4, two N-channel transistors $Q_1$ and $Q_2$ are connected in parallel between the power supply $V_{ss}$ and the output terminal OUT to form a load L, while two P-channel transistors $Q_{11}'$ and $Q_{12}'$ are connected in series between the power supply $V_{cc}$ and the output terminal OUT to form a driver circuit $D_1$. As illustrated in FIGS. 5A through 5D, when the potential at the input terminal $IN_1$ remains at $V_{ss}$ and, in addition, the potential at the input terminal $IN_2$ changes from $V_{cc}$ to $V_{ss}$, it is necessary to charge the node $N_1$, having the potential $V_{th2}$, where $V_{th2}$ is the threshold voltage of the transistor $Q_{11}'$, whereby a relatively large delay time $t_1$ is generated. However, as illustrated in FIGS. 6A through 6D, when the potential at the input terminal $IN_2$ remains at $V_{ss}$ and, in addition, the potential at the input terminal $IN_1$ is changed from $V_{cc}$ to $V_{ss}$, it is unnecessary to charge the node $N_1$. As a result, a relatively small delay time $t_2$ is generated. Therefore, a difference in operation speed is generated between the operation as illustrated in FIGS. 5A through 5D and the operation as illustrated in FIGS. 6A through 6D.

In the present invention, the relatively large delay time $t_1$ is shortened so as to eliminate the above-mentioned difference in operation speed.

Figure 7A:
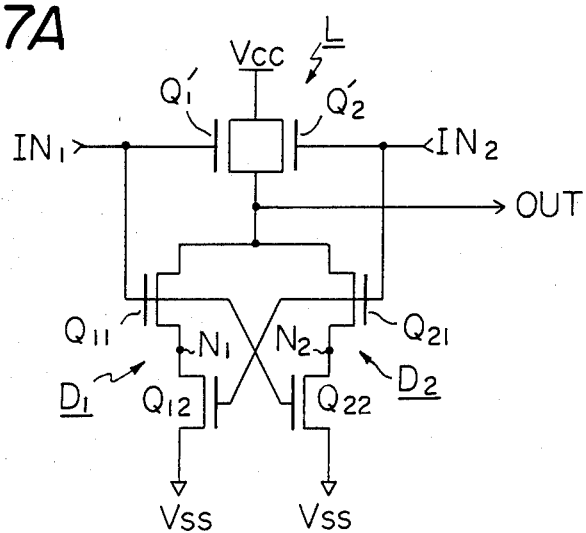
Figure 7B:
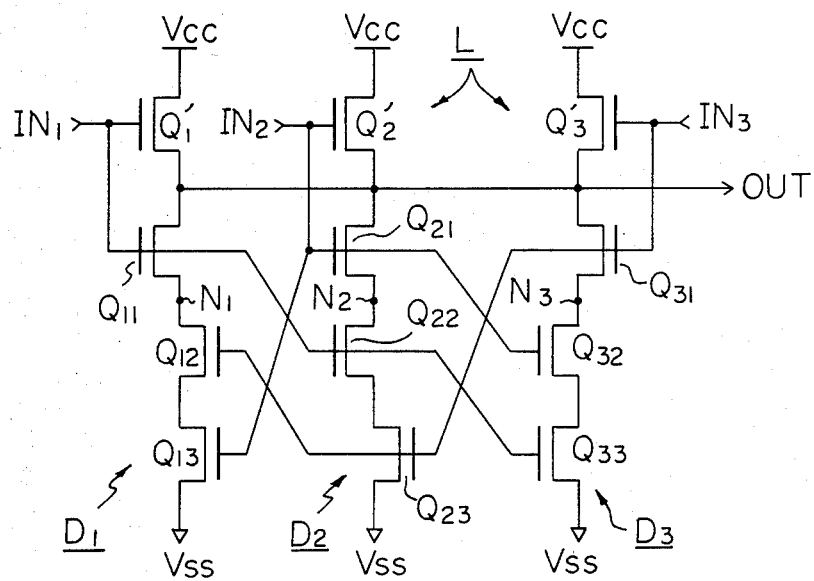
Figure 7D:
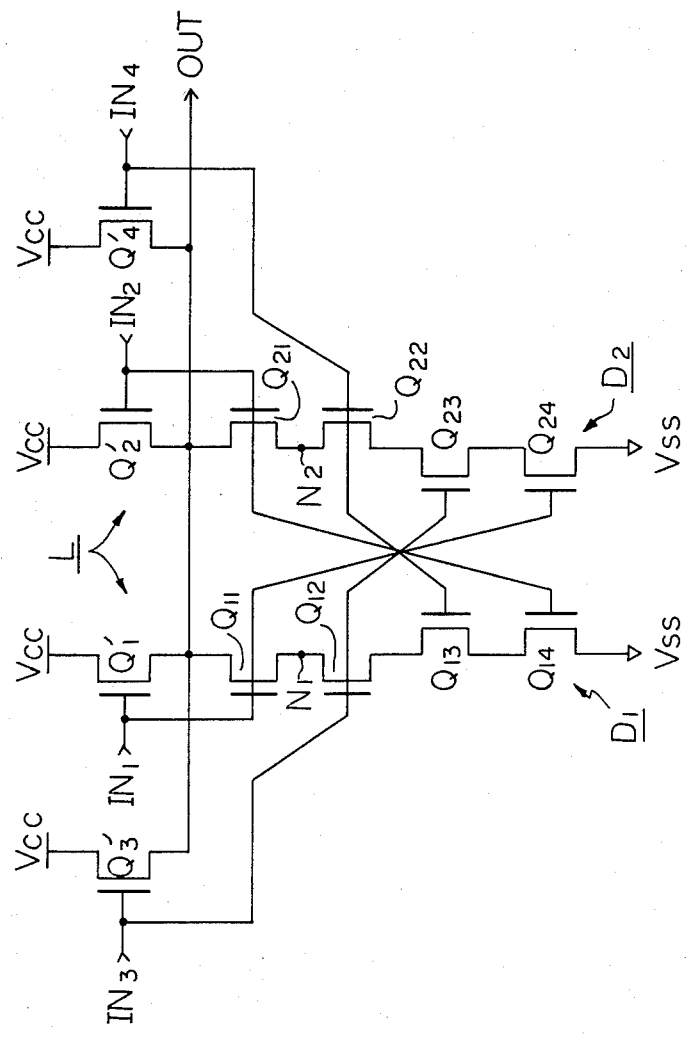
Figure 8A:
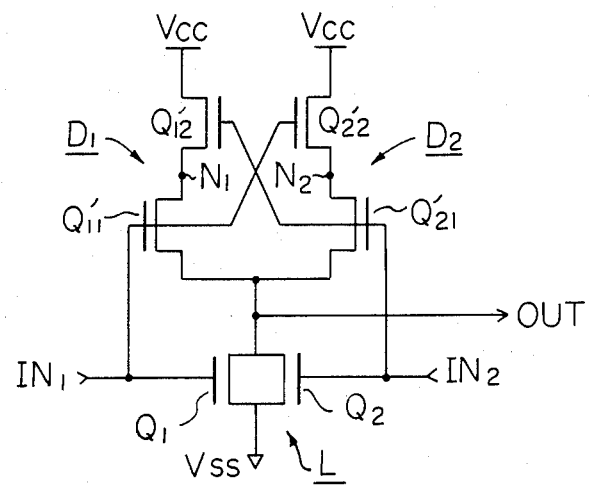
Figure 8B:
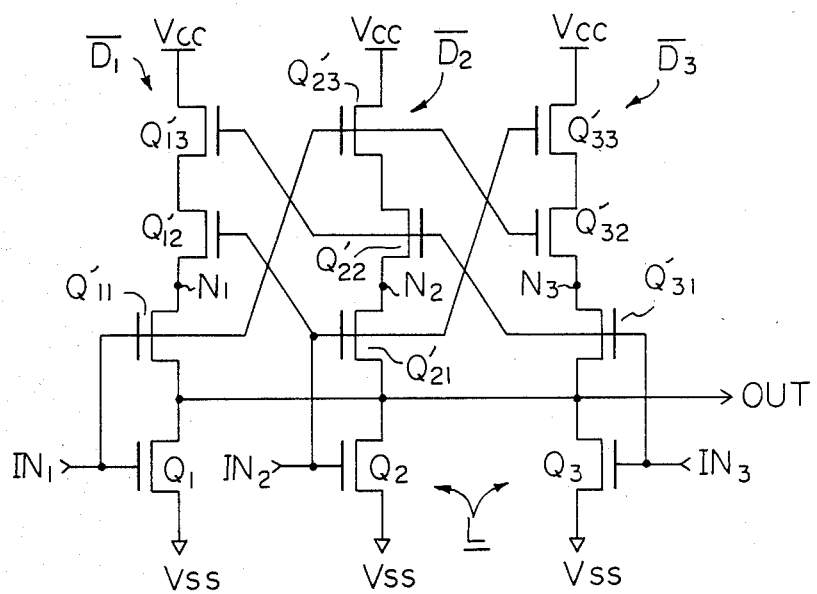
Figure 8C:
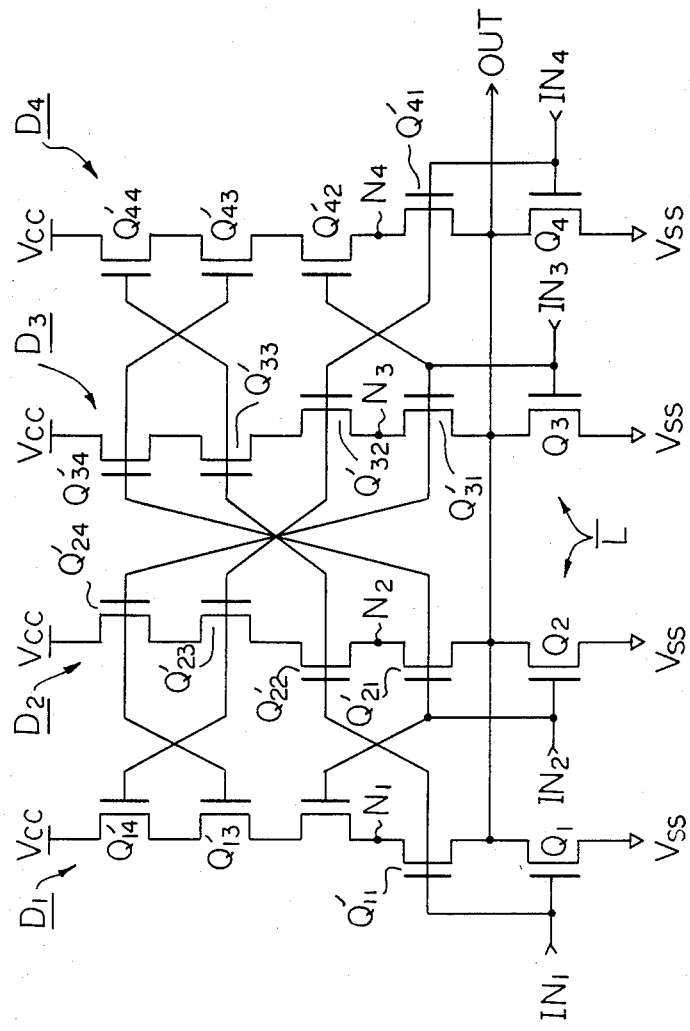
Figure 8D:
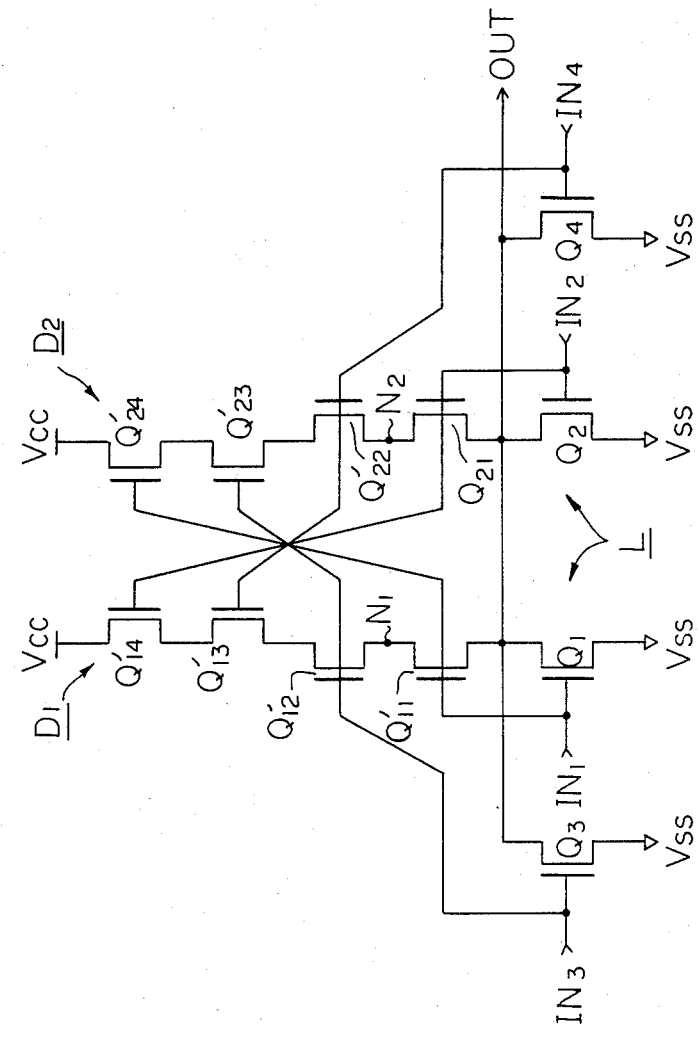

FIGS. 7A, 7B, and 7C are first, second, and third embodiments of the present invention, i.e., a two-input CMIS NAND circuit, a three-input CMIS NAND circuit, and a four-input CMIS NAND circuit, respectively. FIG. 7D is a fourth embodiment of the present invention, also a four-input CMIS NAND circuit.

In the embodiment of FIG. 7A, two driver circuits $D_1$ and $D_2$, connected in parallel, are provided. In the driver circuit $D_1$, a first N-channel transistor $Q_{11}$, connected directly to the output terminal OUT, is driven by the potential at the input terminal $IN_1$, while a second N-channel transistor $Q_{12}$ is driven by the potential at the input terminal $IN_2$. In the driver circuit $D_2$, a first N-channel transistor $Q_{21}$ connected directly to the output terminal OUT is driven by the input terminal $IN_2$ and a second N-channel transistor $Q_{22}$ is driven by the input terminal $IN_1$.

When the potentials at the input terminals $IN_1$ and $IN_2$ are $V_{cc}$ and $V_{ss}$, respectively, the transistors $Q_2'$, $Q_{11}$ and $Q_{22}$ are turned on and the transistors $Q_1'$, $Q_{12}$ and $Q_{21}$ are turned off. As a result, the potential at the node $N_1$ is $V_{cc}-V_{th}$, and the potential at the node $N_2$ is $V_{ss}$. Therefore, when the potential at the input $IN_2$ is changed from $V_{ss}$ to $V_{cc}$, the transistor $Q_2'$ is turned off and the transistor $Q_{21}$ is turned on, so that the potential at the output terminal OUT is changed quickly from $V_{cc}$ to $V_{ss}$ under the influence of the discharged node $N_2$. However, when the potential at the input terminal $IN_2$ remains at $V_{cc}$ and, in addition, the potential at the input terminal $IN_1$ is changed from $V_{ss}$ to $V_{cc}$, the potential at the output terminal OUT is also changed quickly from $V_{cc}$ to $V_{ss}$ under the influence of the discharged node $N_1$, in the same way as in FIG. 1. That is, in all cases, the operation time is $t_2$ as shown in FIG. 3D.

In the embodiment of FIG. 7B, three driver circuits $D_1$, $D_2$, and $D_3$, connected in parallel, are provided. The structure of the circuit of FIG. 7B is similar to that of the circuit of FIG. 7A. That is, first N-channel transistors $Q_{11}$, $Q_{21}$ and $Q_{31}$ of the driver circuits, connected directly to the output terminal OUT, are driven by the potentials at the input terminals $IN_1$, $IN_2$ and $IN_3$, respectively. Therefore, when two of the potentials at the input terminals $IN_1$, $IN_2$ and $IN_3$ remain at $V_{cc}$ and the other potential remains at $V_{ss}$, the potential at only one of the nodes $N_1$, $N_2$ and $N_3$ remains at $V_{ss}$. For example, when the potentials at the input terminals $IN_1$ and $IN_2$ remain at $V_{cc}$, and the potential at the input terminal $IN_3$ remains at $V_{ss}$, the potential at only the node $N_3$ is $V_{ss}$. As a result, when the potential at the input terminal $IN_3$ is changed from $V_{ss}$ to $V_{cc}$, the potential at the output terminal OUT is changed quickly from $V_{cc}$ to $V_{ss}$ under the influence of the discharged node $N_3$.

In the embodiment of FIG. 7C, four driver circuits, $D_1$, $D_2$, $D_3$ and $D_4$, connected in parallel, are provided. The structure of the circuit of FIG. 7C is also similar to that of the circuit of FIGS. 7A or 7B. That is, first N-channel transistors $Q_{11}$, $Q_{21}$, $Q_{31}$ and $Q_{41}$ of the driver circuits, connected directly to the output terminal OUT, are driven by the potentials at the input terminals $IN_1$, $IN_2$, $IN_3$ and $IN_4$, respectively. Therefore, when three of the potentials at the input terminals $IN_1$, $IN_2$, $IN_3$ and $IN_4$ remain at $V_{cc}$ and the other potential remains at $V_{ss}$, the potential at only one of the nodes $N_1$, $N_2$, $N_3$ and $N_4$ remains at $V_{ss}$. For example, when the potentials at the input terminals $IN_1$, $IN_2$ and $IN_3$ remain at $V_{cc}$, and the potential at the input terminal $IN_4$ remains at $V_{ss}$, the potential at only the node $N_4$ is $V_{ss}$. As a result, when the potential at the input terminal $IN_4$ is changed from $V_{ss}$ to $V_{cc}$, the potential at the output terminal OUT is changed quickly from $V_{cc}$ to $V_{ss}$ under the influence of the discharged node $N_4$.

In the embodiment of FIG. 7D, a four-input CMIS NAND circuit is illustrated, but only two driver circuits $D_1$ and $D_2$ are provided. In this case, the potentials at the input terminals $IN_1$ and $IN_2$ are more important than the potentials at the input terminals $IN_3$ and $IN_4$. That is, first N-channel transistors $Q_{11}$ and $Q_{21}$ of the driver circuits $D_1$ and $D_2$, connected directly to the output terminal OUT, are driven by the potentials at the input terminals $IN_1$ and $IN_2$, respectively. Therefore, when the potential at input terminal $IN_1$ or $IN_2$ remains at $V_{ss}$ and the potentials at the other input terminals are $V_{cc}$, the potential at the node $N_1$ or $N_2$ is $V_{ss}$. Therefore, when the potential at the input terminal $IN_1$ or $IN_2$ is changed from $V_{ss}$ to $V_{cc}$, the potential at the output terminal OUT is changed quickly from $V_{cc}$ to $V_{ss}$. However, when the potential at the input terminal $IN_3$ or $IN_4$ is changed from $V_{ss}$ to $V_{cc}$, the potential at the output terminal OUT cannot be changed quickly from $V_{cc}$ to $V_{ss}$. Therefore, the circuit of FIG. 7D is useful only when to specific input conditions exist.

FIGS. 8A, 8B, 8C and 8D are fifth, sixth, seventh and eighth embodiments of the present invention, i.e., CMIS NOR circuits. Note that the embodiments of FIGS. 8A, 8B, 8C and 8D roughly correspond to the embodiments of FIGS. 7A, 7B, 7C and 7D, respectively. For example, the circuit of 8A is the same as the circuit of FIG. 7A, except the load L and the driver circuits $D_1$ and $D_2$ are reversed in respect with the output terminal OUT and the P-channel transistors of the load L are changed to an N-channel type and vice versa.

The operation of the circuits of FIGS. 8A, 8B, 8C and 8D are similar to the operation of the circuits of FIGS. 7A, 7B, 7C and 7D, respectively. For example, in the embodiment of FIG. 8B, when two of the potentials at the input terminals $IN_1$, $IN_2$ and $IN_3$ remain at $V_{ss}$ and the other potential remains at $V_{cc}$, the potential at only one of the nodes $N_1$, $N_2$ and $N_3$ remains at $V_{cc}$. For example, when the potentials at the input terminals $IN_1$ and $IN_2$ remain at $V_{ss}$, and the potential at the input terminal $IN_3$ remains at $V_{cc}$, the potential at only the node $N_3$ is $V_{cc}$. As a result, when the potential at the input terminal $IN_3$ is changed from $V_{cc}$ to $V_{ss}$, the potential at the output terminal OUT is changed quickly from $V_{ss}$ to $V_{cc}$ under the influence of the charged node $N_3$.

FIGS. 7A through 7D and FIGS. 8A through 8D are CMIS logic circuits. However, note that the present invention can be also applied to enhancement/depletion (E/D) type MIS logic circuits and conventional MIS logic circuit.

Figure 9A:
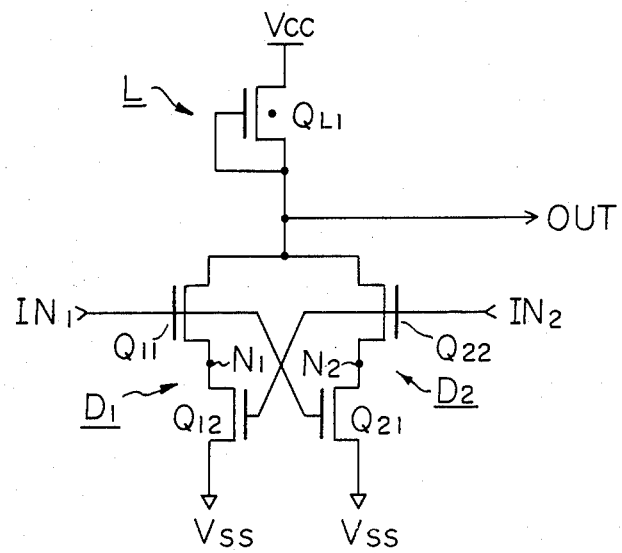
Figure 9B:
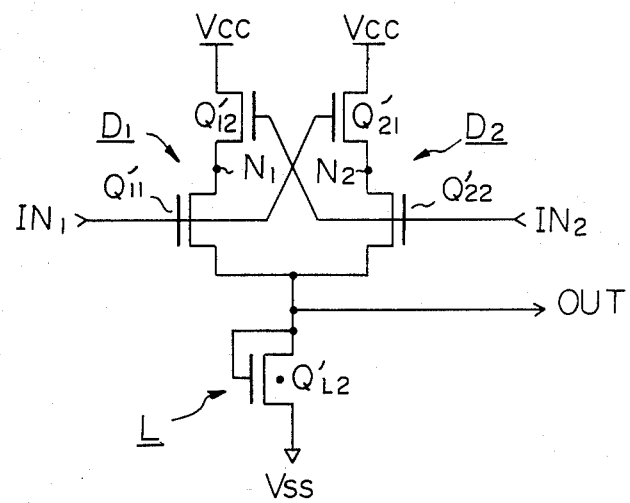
Figure 10A:
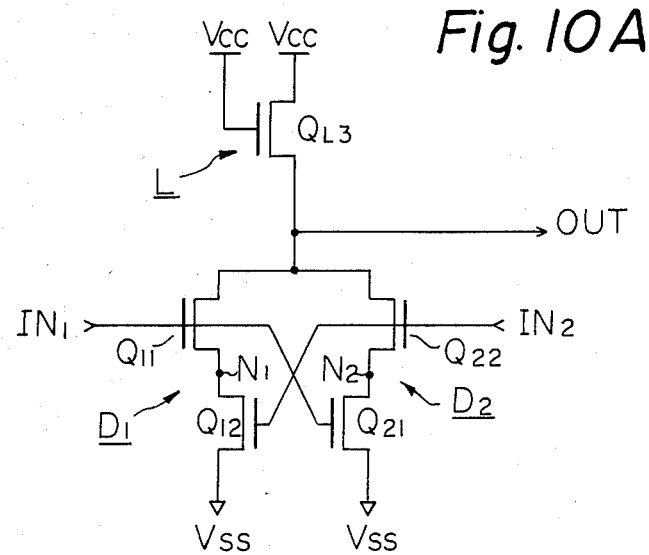
Figure 10B:
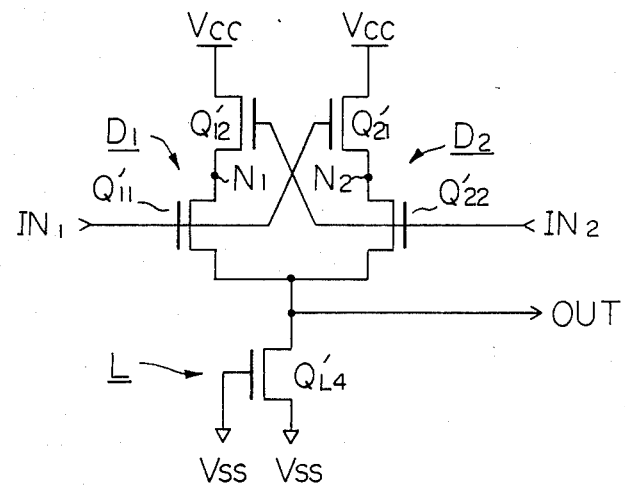

In an E/D MIS logic circuits such as an E/D MIS NAND circuit as illustrated in FIG. 9A or an E/D MIS NOR circuit as illustrated in FIG. 9B, the load L is constructed by a deletion-type transistor $Q_{L1}$ (N-channel) or $Q_{L2}'$ (P-channel) in which the source and gate are connected to each other. On the other hand, in a conventional MIS logic circuit such as a NAND circuit as illustrated in FIG. 10A or an NOR circuit as illustrated in FIG. 10B, the load L is constructed by a enhancement-type transistor $Q_{L3}$ (N-channel) or $Q_{L4}'$ (P-channel) in which the drain and gate are connected to each other.

The application of the circuits according to the present invention will now be explained with reference to FIG. 11.

Figure 11:
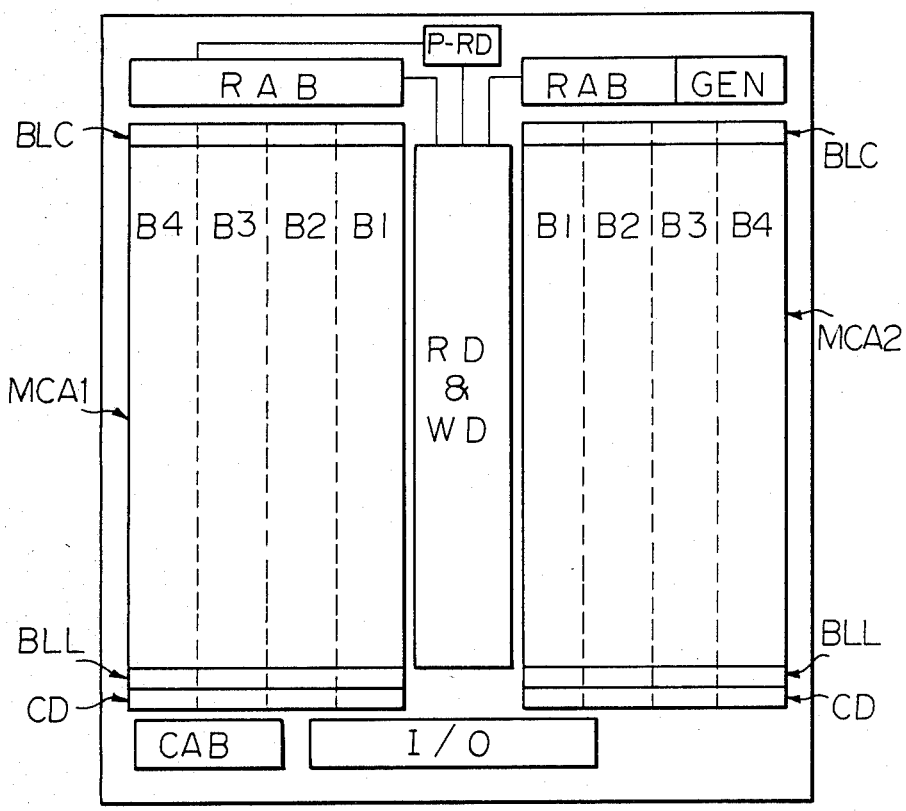
FIG. 11 is a circuit diagram of a semiconductor device to which the present invention is applied.
Figure 12:
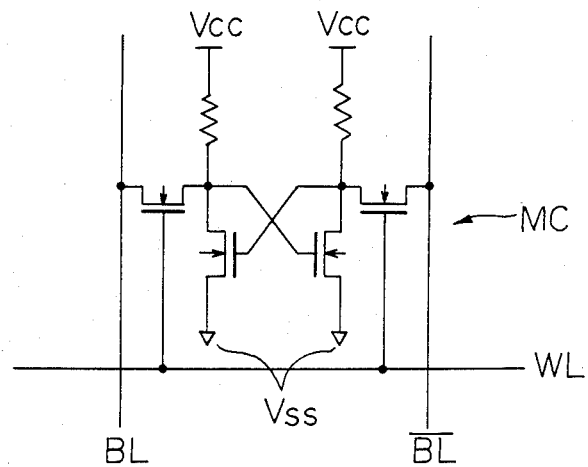
FIG. 12 is a circuit diagram of a memory cell of FIG. 11.
Figure 13:
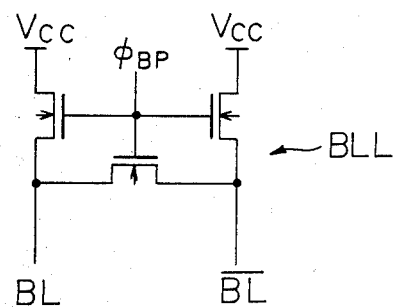
FIG. 13 is a circuit diagram of the bit line precharging circuit of FIG. 11.
Figure 14:
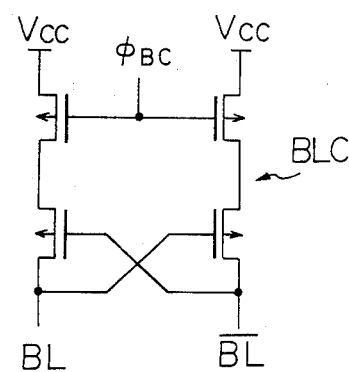
FIG. 14 is a circuit diagram of the bit line sensing circuit of FIG. 11.
Figure 15:
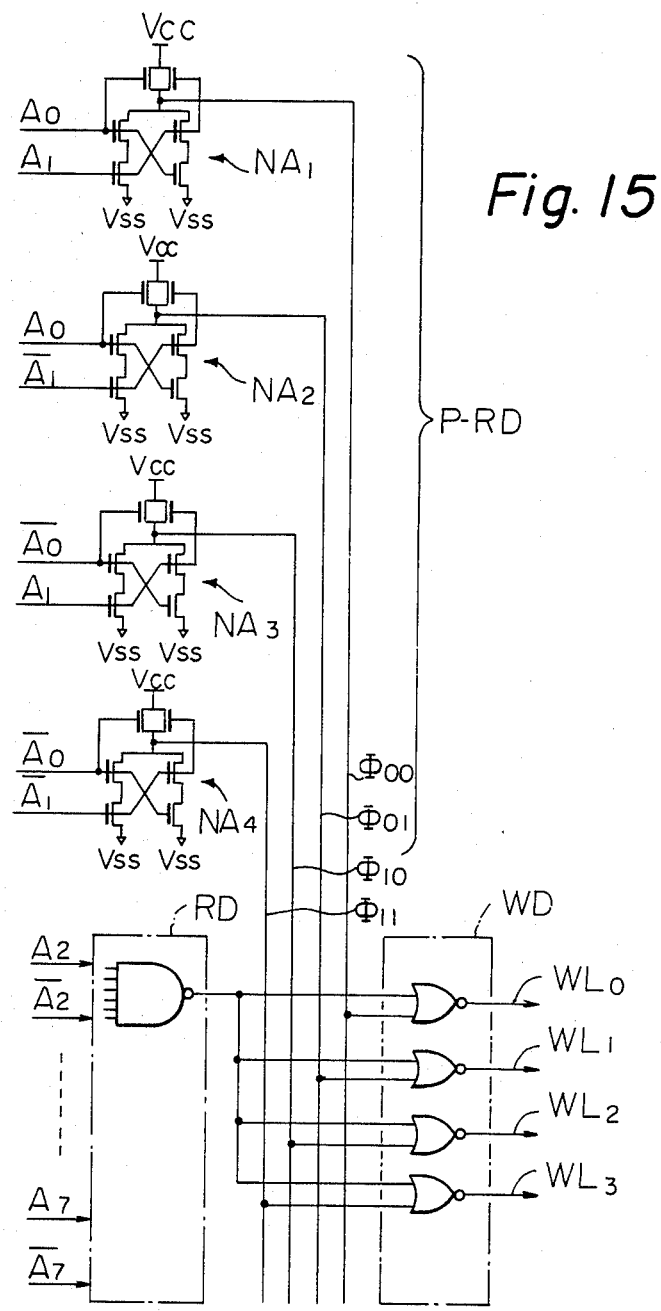
FIG. 15 is a circuit diagram of the pre-decoders of FIG. 11.

In FIG. 11, a 64 Kbit static random access memory (RAM) is illustrated. References MCA1 and MCA2 designate memory cell arrays formed by a large number of memory cells MC as illustrated in FIG. 12; RAB row address buffers; CAB column address buffers; I/O input/output circuits; GEN a bit line control clock generator circuit; P-RD pre-decoders, as illustrated in FIG. 15; RD row decoders; WD word drivers; CD column decoders; BLL bit line precharging circuits as illustrated in FIG. 13; and BLC bit line sensing circuits as illustrated in FIG. 14.

In a highly integrated large-capacity memory device, each memory cell MC is very small in size. Accordingly, the pitch between adjacent rows is also extremely narrow. Therefore, it is difficult to place one decoder for each row. In order to overcome this, one row decoder is allocated to every two or four word lines. For example, as illustrated in FIG. 15, the pre-decoders P-RD determine the selection modes $\Phi_{00}$, $\Phi_{01}$, $\Phi_{10}$ and $\Phi_{11}$. In the pre-decoders P-RD, four NAND circuits $NA_1$, $NA_2$, $NA_3$ and $NA_4$ of FIG. 7A are used.

The logic circuits according to the present invention can also be applied to the bit line control clock generator circuit GEN of FIG. 11, which will now be explained in more detail. One bit line precharging circuit and one bit line sensing circuit are provided for each bit line pair. That is, during the read mode, the bit line precharging circuits BLL are controlled by a clock signal $\phi_{BP}$ from the bit line control clock generator circuit GEN to precharge the corresponding bit lines. After that, the bit lines become in a floating state. Next, one selected memory cell is connected to each bit line pair. As a result, the small difference in potential between the bit line pair is sensed and enlarged by the corresponding bit line sensing circuit BLC, which is controlled by a clock signal $\phi_{BC}$ from the bit line control clock generator circuit GEN.

Figure 16:
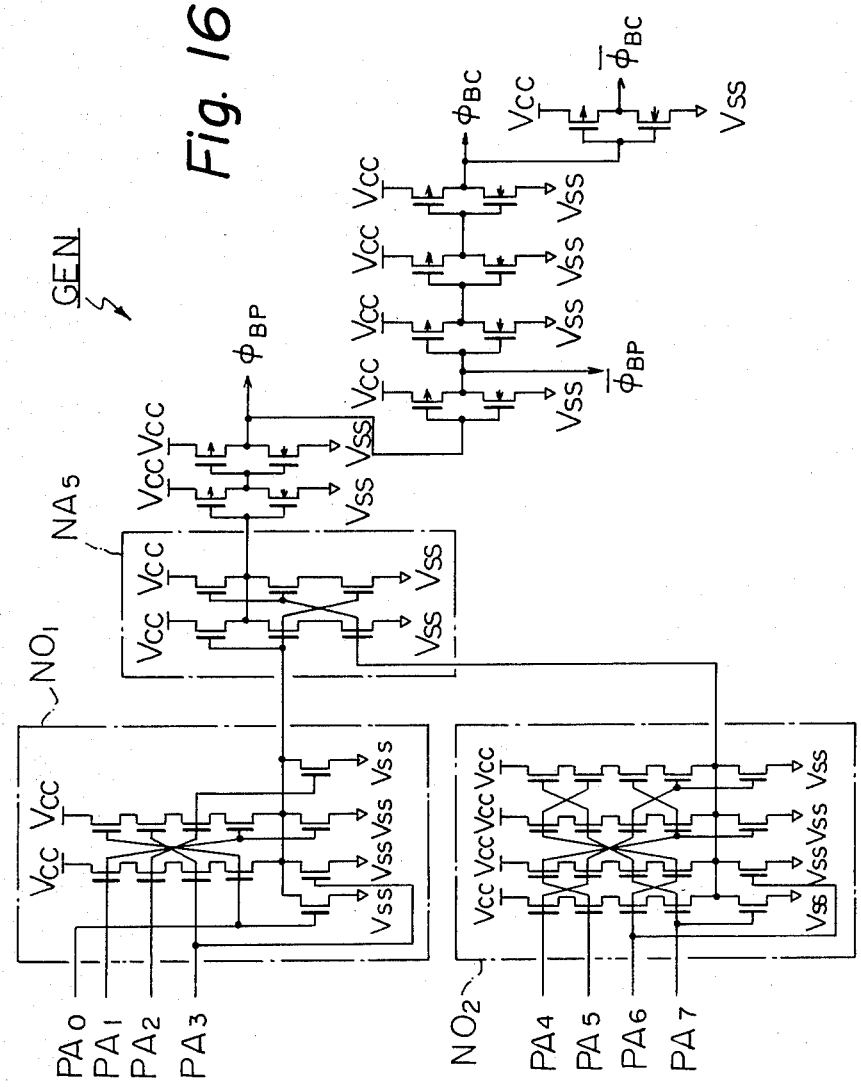
FIG. 16 is a circuit diagram of the bit line control clock generator circuit of FIG. 11.
Figure 17:
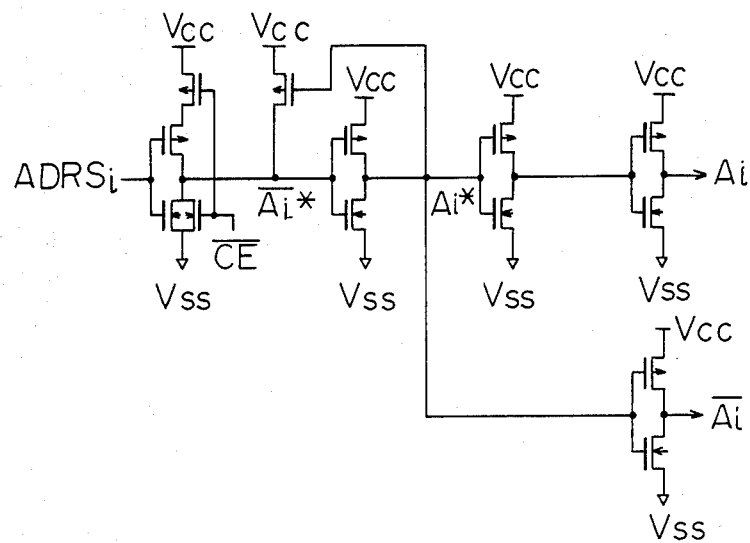
FIG. 17 is a circuit diagram of the address buffer of FIG. 11.
Figure 18:
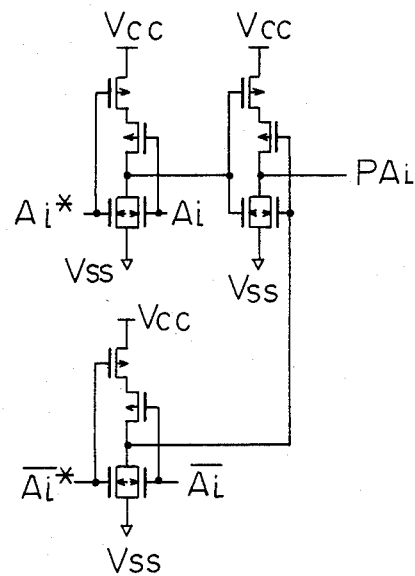
FIG. 18 is a circuit diagram of the circuit for generating the pre-clock signals $PA_i$ (i=0 to 7) of FIG. 16.

FIG. 16 is one example of the bit line control clock generator circuit GEN of FIG. 11. In FIG. 16, the generator circuit GEN comprises a NOR circuit $NO_1$ of FIG. 8D, a NOR circuit $NO_2$ of FIG. 8C, a NAND circuit $NA_5$ of FIG. 7A, and a plurality of inverters. Row address pre-clock signals $PA_0$ through $PA_7$ correspond to external row address signals $ADRS_i$ ($i=0$ to 7, FIG. 17), respectively. For example, when the row address signal $ADRS_0$ changes, the row address pre-clock signal $PA_0$ remains at a high level for a definite time. Otherwise, the signal $PA_0$ always remains at a low level. Such pre-clock signals $PA_0$ through $PA_7$ are obtained by the circuits of FIGS. 17 and 18. Note that $\overline{CE}$ of FIG. 17 designates a memory control signal. The circuits $NO_1$, $NO_2$ and $NA_5$ of FIG. 16 together comprise a circuit for detecting the change of row address signals.

Note that the NOR circuit $NO_1$ comprises only two loads, since, in this case, the signals $PA_0$ and $PA_1$ corresponding to the row address signals $A_0$ and $A_1$ are more important than the signals $PA_2$ and $PA_3$ corresponding to the row address signals $A_2$ and $A_3$.

As illustrated in FIG. 19A, when at least one of the row address signals $PA_0$ through $PA_3$ changes, the output of the NOR circuit $NO_1$ reaches a high level. Similarly, when at least one of the row address signals $PA_4$ through $PA_7$ changes, the output of the NOR circuit $NO_1$ reaches a high level. In all cases, the output of the NAND circuit $NA_5$ reaches a high level. As a result, the clock signal $\phi_{BP}$ changes as illustrated in FIG. 19C, and the clock signal $\phi_{BC}$ changes as illustrated in FIG. 19D. Therefore, the bit line sensing circuit BLC does not perform a sensing operation during the precharging operation mode and a predetermined time after the precharging operation is completed. As a result, the potentials at the bit lines change as illustrated in FIG. 19E.

Generally, the connections between the generator circuit GEN and the circuits BLL and BLC are formed by aluminum, which has a small delay time, while the word line WL is formed by polycrystalline silicon, which has a large delay time. As a result, the potential at the portion of a word line far from the word drivers WD changes slower than the portion of the word line near the word drivers WD. The change of the former is illustrated by a dot and dash line in FIG. 19B. In this case, the change of the potentials of the bit lines is illustrated by a dot and dash line in FIG. 19E. Therefore, it is necessary to delay the clock signals $\phi_{BP}$ and $\phi_{BC}$ in accordance with the delay of the change of the word line portion. For this purpose, the circuits of FIGS. 20A and 20B are added to the circuit of FIG. 16.

Figure 20A:
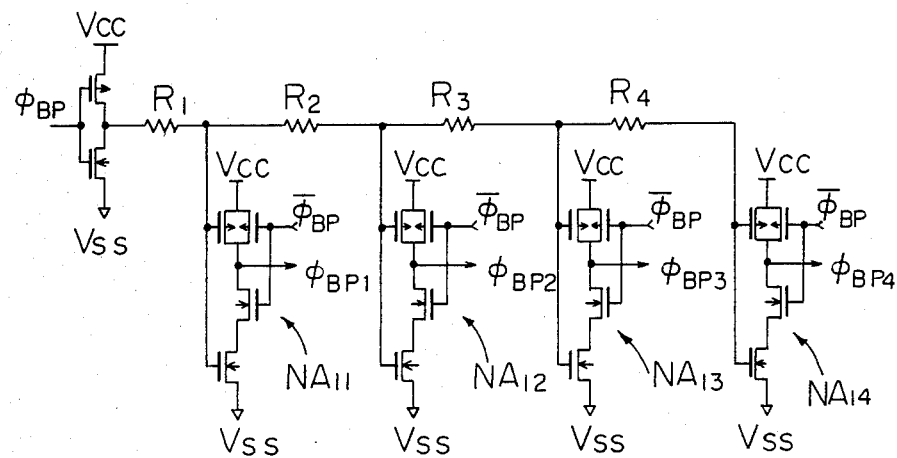
FIGS. 20A and 20B are circuit diagrams of the other embodiments bit line control clock generator circuit of FIG. 11.
Figure 20B:
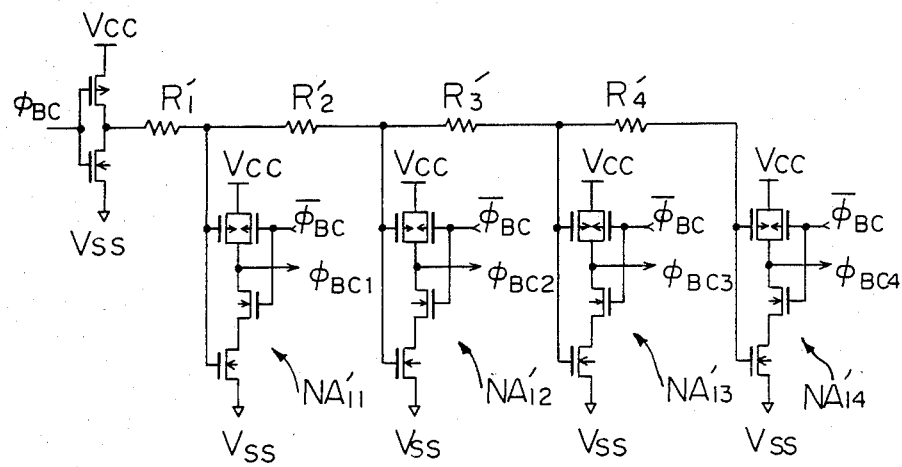

In the combination of the circuits of FIGS. 16, 20A and 20B, four kinds of bit line control clock signals $\phi_{BP1}$, $\phi_{BP2}$, $\phi_{BP3}$ and $\phi_{BP4}$ are generated for the four blocks B1, B2, B3 and B4 of the memory cell arrays MCA1 and MCA2, respectively. In addition, four kinds of bit line sensing clock signals $\phi_{BC1}$, $\phi_{BC2}$, and $\phi_{BC3}$ and $\phi_{BC4}$ are generated for the blocks B1, B2, B3 and B4, respectively.

For example, the circuit of FIG. 20A comprises four resistors $R_1$, $R_2$, $R_3$ and $R_4$ and four NAND circuits $NA_{11}$, $NA_{12}$, $NA_{13}$ and $NA_{14}$. However, these NAND circuits do not always require two driver circuits, since the sequence of the input conditions for the NAND circuits is definite. In FIG. 20A, when the potential of the signal $\phi_{BP}$ is changed from a low level to a high level and, accordingly, the potential of the signal $\overline{\phi_{BP}}$ is changed from a high level to a low level, the potentials of the signals $\phi_{BP1}$, $\phi_{BP2}$, $\phi_{BP3}$ and $\phi_{BP4}$ rise simultaneously, as illustrated in FIG. 21C. However, when the potential of the signal $\overline{\phi_{BP}}$ is changed from a high level to a low level and, accordingly, the potential of the signal $\phi_{BP}$ is changed from a low level to a high level, the signals $\phi_{BP1}$, $\phi_{BP2}$, $\phi_{BP3}$ and $\phi_{BP4}$ fall into the order illustrated by the dashed and dotted lines of FIG. 21C, due to the presence of the delay circuits.

Similarly, the potentials of the clock signals $\phi_{BC1}$, $\phi_{BC2}$, $\phi_{BC3}$ and $\phi_{BC4}$ change in the same way as those of the clock signals $\phi_{BP1}$, $\phi_{BP2}$, $\phi_{BP3}$ and $\phi_{BP4}$, except for the delay times of the fall of the potentials, as illustrated in FIG. 21D. Thus, the delay time of each block B1, B2 B3, and B4 of the memory cell arrays MCA1 and MCA2 can be compensated. In this case, note that it is not important that the potentials of the signals $\phi_{BP1}$ through $\phi_{BP4}$ rise simultaneously. In other words, the signals $\phi_{BC,i+1}$ also be obtained by shifting the signal $\phi_{BC,i}$. Note that FIGS. 21A, 21B and 21E are the same as FIGS. 19A, 19B and 19E, respectively.

As explained hereinbefore, according to the present invention, no fluctuation in operation speed is generated regardless of the condition of the input signals. In addition, the operation speed is increased.

We claim:

1. A logic circuit operatively connected to receive input signals, comprising:
   a first power supply;
   a second power supply having a potential different from that of said first power supply;
   N input terminals, N being an integer greater than or equal to two, for receiving respective input signals;
   an output terminal;
   load means operatively connected between said first power supply and said output terminal; and
   N driver circuits, operatively connected in parallel between said second power supply and said output terminal and being cross-coupled to each other, for coupling said output terminal to said second power supply, each of said driver circuits comprising N gates operatively connected in series, each of said N gates being driven by one of the respective input signals of said N input terminals, when the voltage of one of the input signals on one of said N input terminals becomes different from that of the remaining input signals, the potential of only one of said N gates is changed, so that when the voltage of the input signal of said only one of said N gates is again changed, the voltage at the output terminal is quickly changed.

2. A logic circuit as set forth in claim 1, wherein each of said N gates comprises an N-channel enhancement-type transistor, and wherein the potential of said first power supply is higher than the potential of said second power supply.

3. A logic circuit as set forth in claim 2, wherein said load means comprises a plurality of P-channel enhancement-type transistors, respectively, operatively connected to said plurality of input terminals, each driven by one of the respective potentials of said plurality of input terminals.

4. A logic circuit as set forth in claim 2, wherein said load means comprises an N-channel depletion-type transistor having a drain operatively connected to said first power supply, having a source and having a gate operatively connected to said source and said output terminal.

5. A logic circuit as set forth in claim 2, wherein said load means comprises an N-channel enhancement transistor having a gate, having a drain operatively connected to said gate and said first power supply and having a source operatively connected to said output terminal.

6. A logic circuit as set forth in claim 1, wherein each of said N gates comprises a P-channel enhancement-type transistor, and wherein the potential of said first power supply is lower than the potential of said second power supply.

7. A logic circuit as set forth in claim 6, wherein said load means comprises a plurality of N-channel enhancement-type transistors, respectively, operatively connected to said plurality of input terminals, each driven by one of the respective potentials of said plurality of input terminals.

8. A logic circuit as set forth in claim 6, wherein said load means comprises a P-channel depletion-type transistor having a drain operatively connected to said first power supply, having a source and having a gate operatively connected to said source and said output terminal.

9. A logic circuit as set forth in claim 6, wherein said load means comprises a P-channel enhancement transistor having a gate, having a drain operatively connected to said gate and said first power supply and having a source operatively connected to said output terminal.

10. A logic circuit, operatively connected to receive first and second input signals, having first and second power supplies, the potential of the first power supply being different from that of the second power supply, said logic circuit comprising:
    an output terminal;
    first and second input terminals operatively connected to receive the first and second input signals, respectively;
    first and second driver circuits, operatively connected to said first and second input terminals and to first and second power supplies, for coupling said output terminal to said second power supply, said first driver circuit comprising:
    a first P-channel transistor, operatively connected to said output terminal and said first input terminal, driven by the first input signal;
    a second P-channel transistor, operatively connected between said first transistor and said second power supply and operatively connected to said second input terminal, driven by the second input signal, said second driver circuit comprising:
    a third P-channel transistor, operatively connected to said output terminal and said second input terminal, driven by the second input signal; and
    a fourth P-channel transistor, operatively connected between said third transistor and said second power supply and operatively connected to said first input terminal, driven by the first input signal.

11. A logic circuit, operatively connected to receive first and second input signals, having first and second power supplies, the potential of said first power supply being different from that of the second power supply, said logic circuit comprising:

an output terminal;
first and second input terminals operatively connected to receive the first and second input signals, respectively;
first and second driver circuits, operatively connected to said first and second input terminals and said first and second power supplies, for coupling said output terminal to said second power supply, said first driver circuit comprising:
a first N-channel transistor, operatively connected to said output terminal and to said first input terminal, driven by the first input signal;
a second N-channel transistor, operatively connected between said first transistor and said second power supply and operatively connected to said second input terminal, driven by the second input signal, said second driver circuit comprising:
a third N-channel transistor, operatively connected to said output terminal and said second input terminal, driven by the second input signal; and
a fourth N-channel transistor, operatively connected between said third N-channel transistor and said second power supply and operatively connected to said first input terminal, driven by the first input signal.

* * * * *